(12) United States Patent
Akagawa et al.

(10) Patent No.: US 6,288,769 B1
(45) Date of Patent: Sep. 11, 2001

(54) OPTICAL DEVICE METHOD OF CLEANING THE SAME, PROJECTION ALIGNER, AND METHOD OF PRODUCING THE SAME

(75) Inventors: Masayuki Akagawa; Osamu Yamashita; Taichi Taniuchi, all of Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/458,807

(22) Filed: Dec. 10, 1999

Related U.S. Application Data

(63) Continuation of application No. PCT/JP98/02536, filed on Jun. 9, 1998.

(30) Foreign Application Priority Data

Jun. 10, 1997 (JP) .................................................. 9-152695

(51) Int. Cl.[7] .......................... G03B 27/52; G03B 27/42; G03B 27/32
(52) U.S. Cl. .................................. 355/30; 355/53; 355/77
(58) Field of Search .................................. 355/30, 53, 55, 355/67, 77; 438/795; 134/1, 1.3

(56) References Cited

U.S. PATENT DOCUMENTS

| | | | |
|---|---|---|---|
| 4,616,908 | * 10/1986 | King ........................................ | 350/676 |
| 4,690,528 | * 9/1987 | Tanimoto et al. .................... | 353/101 |
| 4,699,505 | 10/1987 | Komoriya et al. ...................... | 355/30 |
| 4,704,348 | 11/1987 | Koizumi et al. ...................... | 430/327 |
| 4,825,247 | * 4/1989 | Kemi et al. ............................. | 355/55 |
| 5,430,303 | 7/1995 | Matsumoto et al. ............... | 250/492.2 |
| 5,559,584 | 9/1996 | Miyaji et al. .......................... | 355/73 |
| 5,602,683 | * 2/1997 | Straaijer et al. ..................... | 359/811 |
| 5,821,175 | * 10/1998 | Englesberg ........................... | 438/795 |

FOREIGN PATENT DOCUMENTS

| | | |
|---|---|---|
| 2708757 | 2/1995 | (EP) . |
| 0 663 618 A1 | 7/1995 | (EP) . |
| 0 867 774 A2 | 9/1998 | (EP) . |
| 61-79228 | * 9/1984 | (JP) . |
| WO 95/33594 | 12/1995 | (WO) . |

* cited by examiner

Primary Examiner—Russell Adams
Assistant Examiner—Hung Henry Nguyen
(74) Attorney, Agent, or Firm—Armstrong, Westerman, Hattori, McLeland & Naughton, LLP

(57) ABSTRACT

An exposure method for irradiating a mask with an illuminating light and transferring a pattern on the mask onto a substrate through a projection optical system includes supplying a gas having a lower capability of absorbing illuminating light to each of plural chambers formed between optical elements disposed in a barrel, floating a contaminating substance on the plural elements in the gas by irradiation, exhausting the gas and contaminating substances from the barrel, supplying the plural chambers with further gas, after exhausting the gas containing the contaminating substance, and transferring the pattern onto the substrate.

14 Claims, 7 Drawing Sheets

(a)

(b)

OPTICAL DEVICE METHOD OF CLEANING THE SAME, PROJECTION ALIGNER, AND METHOD OF PRODUCING THE SAME

This application is a continuation of international application PCT/JP98/02536 filed on Jun. 9, 1998.

BACKGROUND OF THE INVENTION

The present invention relates to an exposure apparatus and a method for manufacturing the same, which has an excimer laser light source, a higher harmonics laser light source, a mercury lamp light source or the like, each radiating light having an ultraviolet range of a wavelength of, for example, 300 nm or shorter. The present invention also relates to an optical device for a projection optical system or an illumination optical system for use with such an exposure apparatus, and to a method for cleaning such an optical device.

An exposure apparatus for exposing an image of a pattern of a reticle (a photomask or the like) onto a photosensitive substrate through a projection optical system has been employed in a lithography process for manufacturing semiconductor elements, liquid crystal substrates, and so on. Recent years, developments have been performed to make semiconductor integrated circuits finer and finer, and in order to comply with such finer integration of semiconductor circuits, there has been attempted to make shorter an exposing wavelength of a light source for use in a lithography process.

At a current time, an exposure apparatus has already been developed which uses a KrF excimer laser having a wavelength of 248 nm as a light source for a stepper. For example, a higher harmonic wave of a wavelength variable laser such as Ti-sapphire laser, etc., a quadruple harmonic wave of a YAG laser having a wavelength of 266 nm, a fivefold harmonic wave of a YAG laser having a wavelength of 213 nm, a mercury lamp having a wavelength close to 220 nm or a wavelength of 184 nm, and an ArF excimer laser having a wavelength of 193 nm draw attention as a candidate for a light source having a shorter wavelength.

For conventional exposure apparatuses which use g-rays, i-rays, a KrF excimer laser, or a mercury lamp emitting light rays having a wavelength close to 250 nm as a light source, emission spectral rays of such a light source do not overlap with an absorption spectral region of oxygen, so that they do not cause any decrease in efficiency of light utilization due to absorption of oxygen and do not suffer from any disadvantage resulting from the generation of ozone due to the absorption of oxygen. Therefore, those exposure apparatuses can basically be used for exposure in ambient atmosphere.

On the other hand, however, for a light source such as an ArF excimer laser, emission spectral rays overlap with an absorption spectral region of oxygen, so that a decrease in efficiency of light utilization may be caused by the adsorption of oxygen, and the disadvantage may also result from the generation of ozone due to the absorption of oxygen. For instance, if it is supposed that a transmittance of an ArF excimer laser light in vacuum or through an inert gas such as nitrogen or helium is 100%/m, the transmittance is decreased to approximately 90%/m, on the one hand, when the light is in a free-run state, i.e., in a natural emission state, that is, the light source is an ArF broad-banded laser, and it is decreased to approximately 98%/m, on the other hand, even when there is used an ArF laser with the spectral width narrowed and so narrow-banded as to avoid rays of absorption of oxygen.

It is considered that the decrease in transmittance is caused due to the absorption of light by oxygen and an influence of ozone generated. The generation of ozone is considered to exert an adverse influence upon the transmittance of light (i.e., efficiency of light utilization) as well as to cause a deterioration in performance of devices due to a reaction with a surface of an optical material or other parts and to cause a pollution of environment.

For the above-mentioned conventional exposure apparatuses having a light source such as an ArF excimer laser in the configuration as described above, it is well known that the entire area of a light passage is required to be filled with an inert gas such as nitrogen or the like, in order to avoid a decrease in transmittance of light and a generation of ozone.

As a result of various exposure experiments using a projection exposure apparatus with an excimer laser light source installed therein and having a relatively large field size, a new phenomenon has now been discovered in that the irradiation of an illuminating light in an ultraviolet region having a wavelength range of, for example, 350 nm or less (e.g., KrF excimer laser having a wavelength of 248 nm or ArF excimer laser having a wavelength of 193 nm, etc.) dynamically fluctuates transmittance or reflectance of an optical element in a projection optical system or a coating material (e.g., a thin film for a reflection preventive film, or the like) for the optical element in the projection optical system. It is further found that this new phenomenon fluctuating the transmittance of light dynamically can be caused to occur in substantially the same way as not only in the case of an optical element disposed in the projection optical system but also in the case of an optical element disposed in an illumination optical system for illuminating a reticle. Moreover, likewise, it is also found that the such phenomenon is caused to occur in the case of an optical element in a light sending system leading the illuminating light leaving from a light source disposed under a floor of a clean room to an illumination optical system installed in the main body of the exposure apparatus, and in the case of the reticle (a quartz plate) itself.

In addition, the such phenomenon is considered to occur, for instance, due to the attachment of impurities contained in a gas (e.g., air, nitrogen gas, etc.) present in a space of a projection light passage or an illumination light passage, molecules of organic substances departing from adhesive or a filling material, etc., for use in fixing optical elements to a barrel, impurities (e.g., water molecules, hydrocarbon molecules, or other substances diffusing the illuminating light) derived from the inner wall) derived from an inner wall of the barrel (e.g., a coated surface for reflective prevention, etc.), or otherwise, or due to the entry (floating) of such impurities or otherwise into the illumination light passage. As a consequence, a serious problem is considered to be caused such that the transmittance or reflectance of the projection optical system, the illumination optical system, and the light sending system fluctuates to a great extent for a relatively short period of time.

SUMMARY OF THE INVENTION

The object of the present invention is to provide an optical device which is so arranged as for an optical element including, for example, lenses constituting a projection optical system, an illumination optical system or a light sending system, or a reflecting mirror or otherwise unlikely to be contaminated, to provide a method for cleaning the optical device, to provide an exposure apparatus using such a projection optical system, an illumination optical system or a light sending system, each being unlikely to be contaminated, which has been cleaned by the method for cleaning, and to provide a method for manufacturing the such exposure apparatus.

Further, the present invention has another object to provide an exposure apparatus that can prevent an optical characteristic (for example, transmittance or reflectance) of an optical member from fluctuating by irradiating the optical member with a radiating beam having a wavelength of, for example, 350 nm or less.

Moreover, the present invention has a further object to provide an exposure apparatus in which an optical member including, for example, an illumination optical system, a projection optical system or a light sending system or otherwise, each being incorporated in the exposure apparatus, is so arranged as to be cleaned.

In order to achieve the object as described above, the optical apparatus according to the present invention is configured in such a manner that a protective filter is disposed apart in a predetermined distance between the optical elements, among plural optical elements disposed in a barrel, which are disposed on the both end sides in the axial direction of the barrel, wherein chambers disposed between the plural optical elements and a space between the optical elements on each of the both end sides and the protective filter is filled with an inert gas in advance.

The optical device according to the present invention is installed in an apparatus for irradiating a mask with an illuminating light and exposing a substrate with the illuminating light through the mask, wherein an inert gas having the lower capability of absorbing the illuminating light is used as the inert gas to be filled therein. The illuminating light to be used therefor has a wavelength of 350 nm or less. Further, upon mounting the optical device on a light passage housing of the illumination optical system installed in the exposure apparatus, it is preferred that the protective filter is detached while the space is being purged with the gas and then the housing is filled with the inert gas, or that the protective filter is detached while the space is being purged with the gas and a fresh protective filter cleaned in advance is mounted on the both sides in an axial direction of the barrel, followed by filling the light passage with the inert gas.

In order to achieve the object as described above, the present invention according to another embodiment provides the optical device comprising a gas supply passage for supplying an inert gas to a barrel with a plurality of optical elements disposed therein; an supply inlet connected to the gas supply passage; a gas discharge outlet for discharging the inert gas present in the barrel; and a removing member for removing a contaminating material, disposed on an inner wall of the gas supply passage.

The optical device according to the another embodiment of the present invention is installed in a device for irradiating a mask with an illuminating light and exposing a substrate with the illuminating light through the mask, wherein a gas having a lower capability of absorbing the illuminating light is used as the inert gas. As the removing member, there may be used an adsorbing material or a filter.

In order to achieve the object as described above, the present invention according to a further embodiment provides an optical device for use with an exposure apparatus for transferring a pattern on a mask onto a substrate, in which the removing member for removing a contaminating material is mounted on an inner surface of a barrel with a plurality of optical elements disposed therein.

Further, in order to achieve the object as described above, the present invention provides the optical device according to a still further embodiment so adapted as to be used for an exposure apparatus that transfers a pattern on a mask onto a substrate by irradiating the mask with an illuminating light, wherein each of plural chambers formed between the plurality of the optical elements disposed in the barrel is provided with a gas supply inlet and a gas discharge outlet, respectively, for supplying and discharging an inert gas having a less capability of absorbing the illuminating light, and each of the gas supply inlet and the gas discharge outlet is provided with an opening-closing valve for opening and closing the gas supply inlet and the gas discharge outlet, respectively.

In addition, in order to achieve the object as described above, the present invention in another aspect provides a light cleaning method for cleaning the optical device for use with an exposure apparatus for transferring a pattern on a mask onto a substrate by irradiating the mask with an illuminating light, the optical device being configured in such a way that each of chambers formed between a plurality of optical elements disposed in a barrel is provided with a gas supply inlet and a gas discharge outlet for supplying and discharging a gas having a lesser capability of absorbing the illuminating light, respectively, and that the gas supply inlet and the gas discharge outlet are each provided with an opening-closing valve for opening and closing the gas supply inlet and the gas discharge outlet, respectively; wherein the optical device is cleaned by the light cleaning method comprising the step for filling the barrel with the gas to a predetermined pressure in such a state that the opening-closing valve of the gas supply inlet is opened while the opening-closing valve of the gas discharge outlet is closed; the step for allowing a contaminating material attached on a surface of the optical elements to float by irradiating the optical elements with the illuminating light in such a state that the opening-closing valves of the gas supply inlet and the gas discharge outlet are both closed; the step for flowing the gas outside and inside the barrel by opening the opening-closing valve of the gas supply inlet and the opening-closing valve of the gas discharge outlet; and the step for closing the opening-closing valves of the gas supply inlet and the gas discharge outlet, respectively.

With the above configuration, it is also possible to flow the inert gas through each of the plural chambers in such a state that the opening-closing valves of the gas supply inlet and the gas discharge outlet are both opened, prior to closing the opening-closing valve of the gas discharge outlet. Moreover, the optical device may be configured in such a manner that the plural chambers are divided into at least two groups, each group having a predetermined number of chambers, and each group is provided with a gas supply inlet and a gas discharge outlet as well as the gas supply inlet and the gas discharge outlet are each provided with an opening-closing valve.

Furthermore, in order to achieve the object as described above, the present invention provides a projection exposure apparatus for transferring a pattern on a mask onto a substrate through a projection optical system by irradiating the mask with an illuminating light, wherein a plurality of chambers, each chamber being formed between a plurality of optical elements disposed in a barrel and provided with a gas supply inlet and a gas discharge outlet for supplying and discharging an inert gas having a lesser capability of absorbing the illuminating light, respectively, and the gas supply inlet and the gas discharge outlet being each provided with an opening-closing valve; wherein the optical device is so arranged as to be cleaned by a light cleaning method comprising the step for filling the barrel with the gas to a predetermined level of pressure in such a state that the opening-closing valve of the gas supply inlet is opened while the opening-closing valve of the gas discharge outlet is closed; the step for allowing a contaminating material attached on a surface of the optical elements to float by irradiating the optical elements with the illuminating light in such a state that the opening-closing valves of the gas supply inlet and the gas discharge outlet are both closed; the step for flowing the gas outside and inside the barrel by opening the opening-closing valve of the gas supply inlet and the opening-closing valve of the gas discharge outlet; and the step for closing the opening-closing valves of the gas supply inlet and the gas discharge outlet, respectively.

The optical device according to the present invention may also be used as the projection optical system and/or the illumination optical system for irradiating the mask with the illuminating light.

In order to achieve the object as described above, the present invention in a further aspect provides an exposure apparatus for transferring a pattern on a mask onto a substrate, which comprises an optical system interposed between a light source for emitting an illuminating beam and the substrate; a protective filter disposed at least at an end of a barrel for holding an optical element; and an optical unit having a gas having a lesser capability of absorbing the illuminating beam filled in the barrel, the optical unit being disposed in the optical system.

With the above configuration, the optical device according to the present invention contains an illumination optical system for irradiating the mask with the illuminating beam and has the optical unit disposed in the illumination optical system. Upon mounting the optical unit on the optical system, the protective filter may be detached from the barrel or a new protective filter is exchanged for the older one. Preferably, the optical device according to the present invention is further provided with a gas supply device for supplying an inert gas having a lesser capability of absorbing the illuminating beam, which is disposed in the optical system, and the gas supply device is to be operated after the illuminating beam has been emitted in such a state that the optical system is filled with the inert gas. Moreover, it is preferred that the optical device is further provided with a gas exhaust device for discharging the inert gas present in the optical system and that the gas exhaust device is operated prior to filling or supplying the optical system with the inert gas. The illuminating beam to be used therefor may have a wavelength preferably in the range of from 100 nm to 200 nm, and it may preferably include, for example, ArF laser or $F_2$ laser. Moreover, the inert gas may preferably include, for example, nitrogen, helium, or the like.

In addition, in order to achieve the object as described above, the present invention in a still further embodiment provides the exposure apparatus for transferring a pattern on a mask onto a substrate, which comprises an optical system interposed between a light source for emitting an illuminating beam and the substrate; a gas supply device for supplying an inert gas having a lesser capability of absorbing the illuminating beam to at least a portion of the optical system; and a gas exhaust device for discharging the inert gas from the portion of the optical system prior to the supply of the inert gas.

With the above configuration, the optical device according to the present invention may contain an illumination optical system for irradiating the mask with the illuminating beam, a light sending system interposed between the light source and the illumination optical system, and a projection optical system for projecting the illuminating beam leaving from the mask onto the substrate. With this configuration, it is preferred that the gas exhaust device and the gas supply device are operated one after another in this order after the optical system has been cleaned by means of light by irradiating the optical system with the illuminating beam. The illuminating beam to be used therefor may have a wavelength preferably in the range of from 100 nm to 200 nm, and it may preferably include, for example, ArF laser or $F_2$ laser. Moreover, the inert gas may preferably include, for example, nitrogen, helium, or the like.

In order to achieve the object as described above, the present invention in a still further aspect provides a method for the production of the exposure apparatus, which comprises locating a protective filter at least at an end of a barrel holding optical elements, filling the barrel with an inert gas having a lesser capability of absorbing the illuminating beam, and locating the barrel between a light source for emitting the illuminating light and the substrate.

In the method for the production of the exposure apparatus according to the present invention, the protective filter is detached or a new protective filter is exchanged for the older protective filter, after the barrel has been disposed.

Moreover, in order to achieve the object as described above, the present invention in a still further embodiment provides a method for the production of the exposure apparatus for exposing the substrate to the illuminating beam through the mask, which comprises irradiating at least a portion of the optical system capable of allowing the illuminating beam to pass therethrough with a cleaning light for cleaning the optical system and replacing the gas present in the optical system with a gas having a lesser capability of absorbing the illuminating beam.

BRIEF DESCRIPTION OF THE DRAWINGS

FIG. 3 is a schematic illustration showing an illuminating lens unit 2; in which FIG. 3(a) is a sectional view; and FIG. 3(b) is an enlarged view showing a portion of a quick coupler Q1 of FIG. 2(a).

DETAILED DESCRIPTION OF THE INVENTION

A description will be made of the embodiment according to the present invention with reference to FIGS. 1 to 8.

Figure 1:
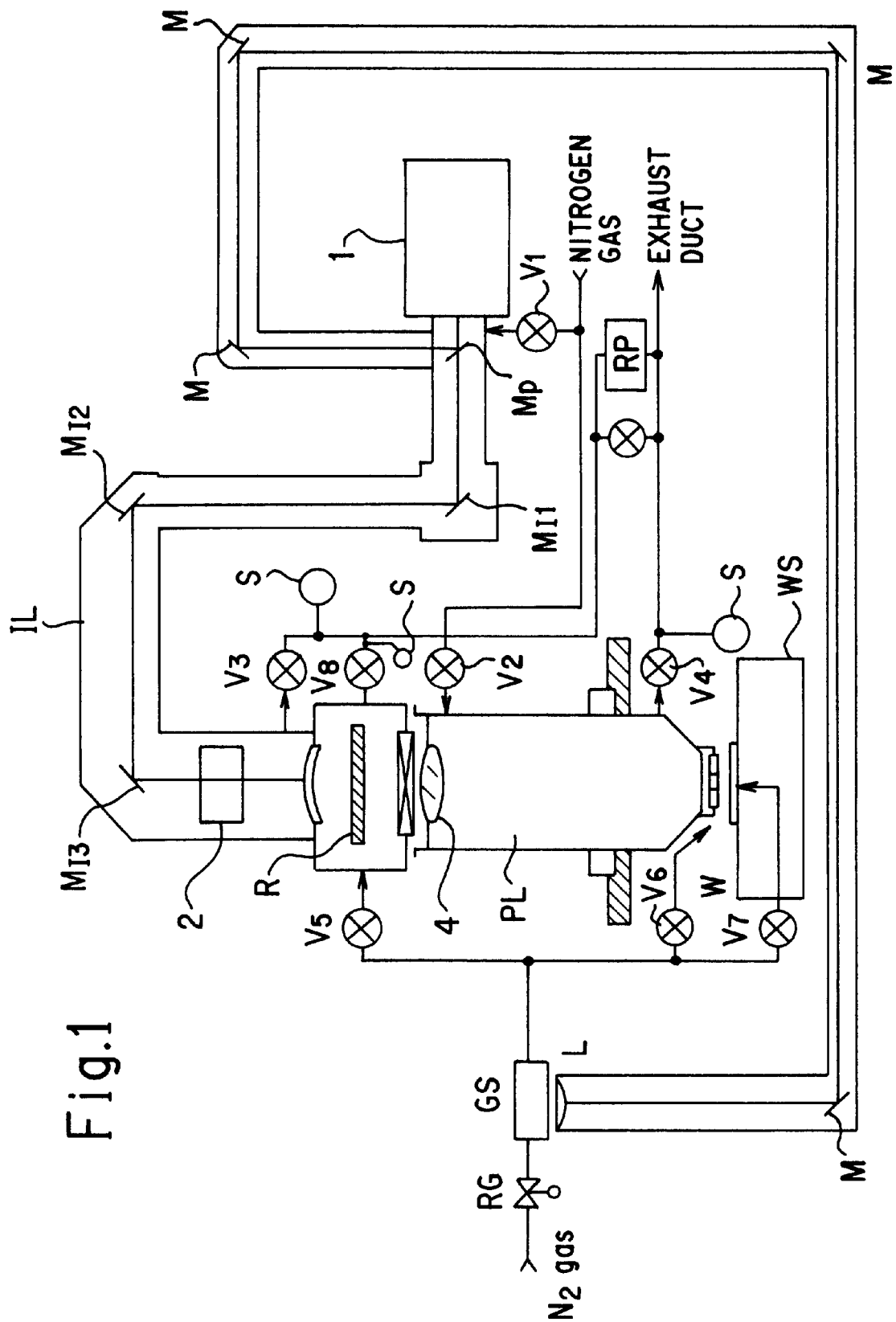
FIG. 1 is a schematic illustration of an exposure apparatus in an embodiment of the present invention.

FIG. 1 is a view for schematically explaining an exposure apparatus according to the embodiment of the present invention. As shown in FIG. 1, a light source 1 for emitting an ArF excimer laser light is disposed separately from a chamber in which the main body of the exposure apparatus is housed. A portion of the light beam leaving from the light source 1 is transmitted through a light sending system, that is, a beam splitter (a partial mirror) Mp to a mirror $M_{f1}$ while the remaining is reflected and then travels toward a mirror M. The light passed through the beam splitter Mp is reflected at mirrors $M_{f1}$, and $M_{f2}$ in the light sending system and at a mirror $M_{f3}$ in an illumination optical system IL, thereby illuminating a reticle R in a uniform manner through an illuminating lens unit 2 disposed in the illumination optical system IL. FIG. 1 shows an integral combination of the light sending system and the illumination optical system IL. In FIG. 1, only one illuminating lens unit 2 is shown, although in usual cases the illumination optical system IL comprises a plurality of illuminating lens units 2 (containing, e.g., a flyeye lens unit, a relay lens unit, a condenser lens unit, etc.). The light sending system and the illumination optical system IL are enclosed with a container, and the container is supplied with a gas having no or a lesser capability of absorbing an ArF light, such as, for example, nitrogen gas (or helium gas), through a valve V1. Although not shown, the reticle R is loaded on a stage and allowed to be transferred relatively to the illuminating light leaving through a slit or otherwise of a vision field stop of the illumination optical system IL.

The light passed through the reticle R is transmitted through a variety of optical members constituting an projection optical system PL, e.g., a lens element and/or a mirror, onto the surface of a wafer W loaded on a wafer stage WS, and a pattern formed on the reticle R is imaged on the surface of the wafer W. The wafer stage WS is so arranged as to transfer the wafer W in a direction relative to the light leaving from the reticle R by irradiating it with the illuminating light and passing through the projection optical system PL. Upon exposure, the reticle R and the wafer W are scanned in directions opposite to each other at a velocity ratio corresponding to a magnification of the projection optical system. The projection optical system PL is provided with at least one projecting lens unit 4, and the projection optical system PL is enclosed with a container in substantially the same manner as the illumination optical system IL. The container is supplied with a nitrogen gas or otherwise through a valve V2. The details of the illuminating lens unit 2 and the projecting lens unit 4 will be described hereinafter.

Figure 2:
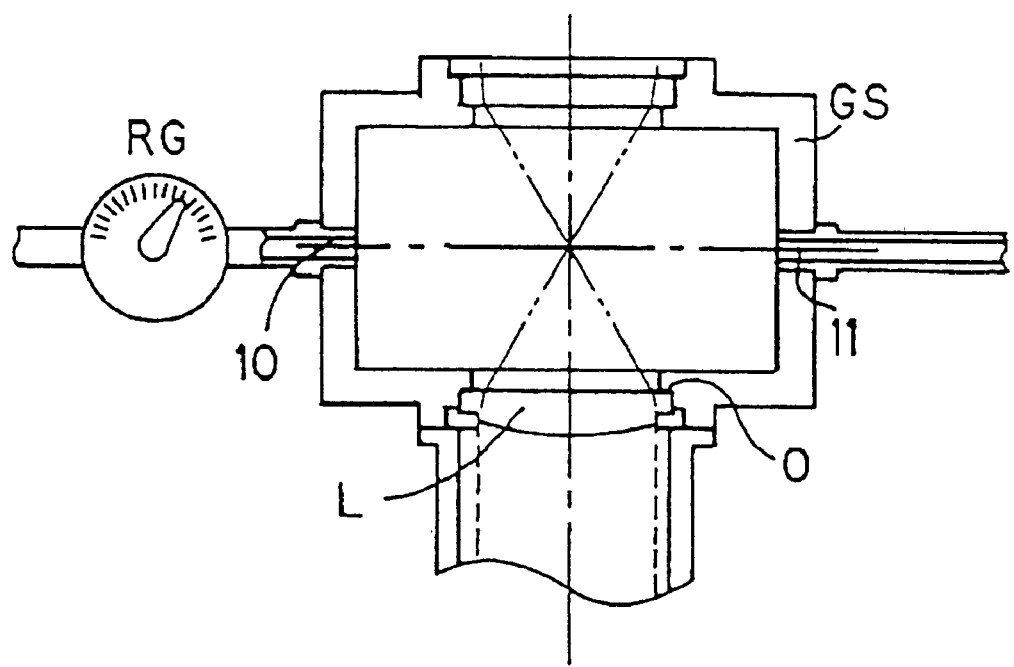
FIG. 2 is a view showing details of a gas cell GS.
Figure 3:
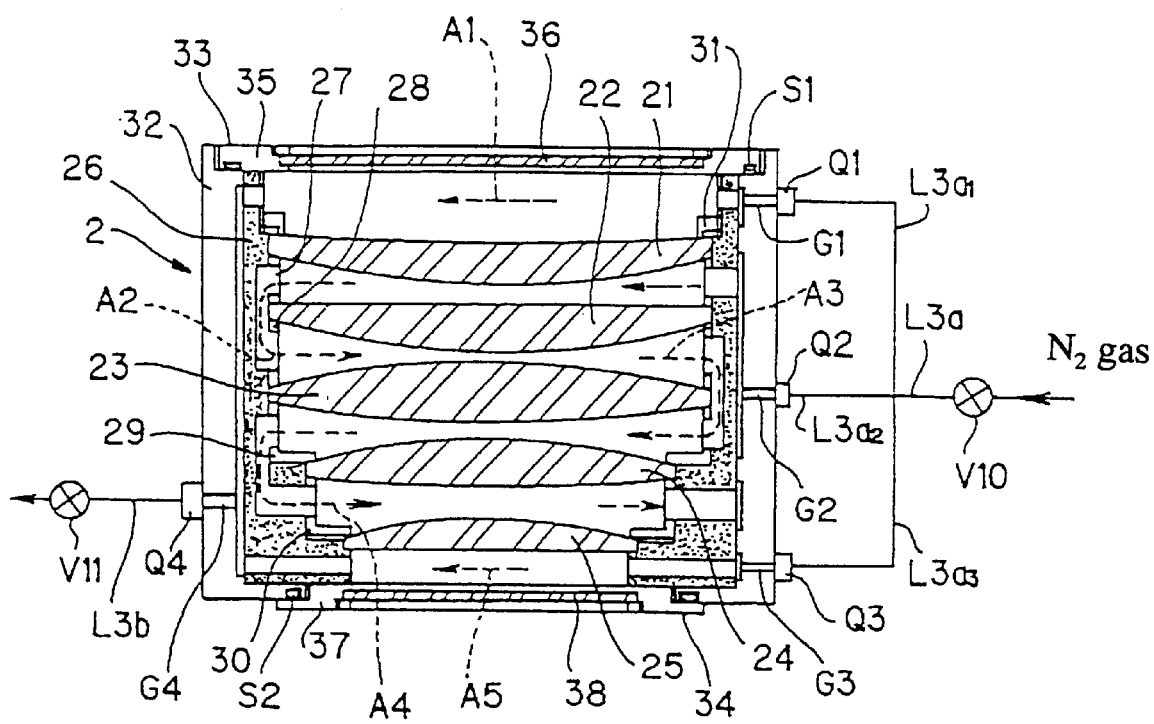
Figure 3:
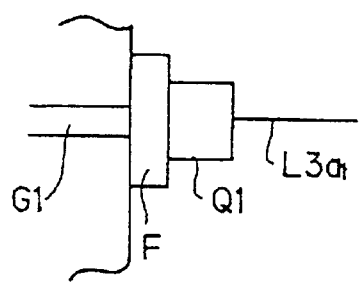

The container for enclosure of the illumination optical system IL is provided with a valve V3 for discharging nitrogen gas therefrom, and the nitrogen gas discharged from the valve V3 is sent to an exhaust duct by the aid of a rotary pump RP. The container is also provided with a valve V4 for discharging nitrogen gas therefrom, and the nitrogen gas discharged through the valve V4 is then supplied to an exhaust duct through the rotary pump RP. The light left from the light source 1 and reflected at the beam splitter Mp is then reflected by means of a plurality of mirrors M disposed and arranged in an appropriate manner, and enters into a gas cell GS through a lens L. The gas cell GS is supplied with nitrogen gas through a pressure reducing valve RG. As shown in FIG. 2, the gas cell GS is provided with an orifice O, and the lens L is disposed so as to seal the orifice O. The light entering into the gas cell GS through the lens L is so arranged as to be focused on an axis connecting a gas supply inlet 10 to a gas discharge outlet 11. The nitrogen gas is ionized in the gas cell GS by the two-photon absorption action of ultraviolet light.

The ionized nitrogen gas discharged from the gas cell GS is divided into three paths, each being supplied to a container enclosing the reticle R and a reticle stage through a valve V5, to a bottom end portion of the projection optical system PL through a valve V6, and to the wafer WS through a valve V7. The container for enclosing the reticle R and the reticle stage is provided with a valve V8 through which the nitrogen gas is discharged. The nitrogen gas discharged through the valve V8 is supplied to an exhaust duct through an oxygen sensor S and the rotary pump RP.

Detailed Description of Illuminating Lens Unit

FIG. 3(a) is a view in section of the illuminating lens unit 2 disposed in the illumination optical system IL. A barrel 26 has lenses 21 to 25, inclusive, and lens separation rings 27 to 30, inclusive, disposed each so as to hold the lenses in a predetermined distance from one another. Moreover, the lenses and the lens separation rings are fixed to the barrel 26 by means of a pressing ring 31. The barrel 26 is housed in a casing 32, and caps 33 and 34 are mounted on the top and bottom openings (when looked at the drawing) of the casing 32 through O-ring seals S1 and S2, respectively. The cap 33 is configured such that a glass member 36 is mounted on a frame 35, and the cap 34 is configured such that a glass member 38 is mounted on a frame 37. The casing 32 is provided with a tubular path L3a for supplying nitrogen gas and a tubular path L3b for discharging the nitrogen gas, and the tubular paths L3a and L3b are provided with valves V10 and V11, respectively. The tubular path L3a for the supply of the gas is divided into three tubular path divisions $L3a_1$, $L3a_2$ and $L3a_3$, the tubular path division $L3a_1$ being connected to a gas supply inlet G1 through a quick coupler Q1, the tubular path division $L3a_2$ being connected to a gas supply inlet G2 through a quick coupler Q2, and the tubular path division $L3a_3$ being connected to a gas supply inlet G1 through a quick coupler Q3. On the other hand, the tubular path L3b is connected to a gas discharge outlet G4 through a quick coupler Q4.

FIG. 3(b) is an enlarged view of the portion of the quick coupler Q1 of the tubular path division L3a1. As shown in FIG. 3(b), a chemical filter F is disposed on the downstream side of the quick coupler Q1 so as to prevent a contaminating material from entry into the casing 32. Likewise, the other tubular path divisions $L3a_2$ and $L3a_3$ are provided each with a chemical filter F. A description will be made of the chemical filter F hereinafter.

As the nitrogen gas has been supplied from the tubular path L3a, the nitrogen gas supplied to the gas supply inlet G1 through the tubular path division $L3a_1$ is flown through a lens chamber interposed between the cap 33 and the lens 21 in the direction as indicated by the arrow A1, and the nitrogen gas is then discharged through the gas discharge outlet G4 into the tubular path L3b. On the other hand, the nitrogen gas supplied to the gas supply inlet G2 through the tubular path division $L3a_2$ is allowed to flow through a lens chamber interposed between the lenses 21 and 22 and then through a lens chamber interposed between the lenses 22 and 23 in the direction as indicated by the arrow A2, followed by passing through a lens chamber interposed between the lenses 23 and 24 in the direction as indicated by the arrow A3, and through a lens chamber interposed between the lenses 24 and 25 in the direction as indicated by the arrow A4, then followed by discharging the nitrogen gas through the gas discharge outlet G4 to the tubular path division L3b. Further, the nitrogen gas supplied to the gas supply inlet G3 through the tubular path $L3a_3$ is allowed to pass through a lens chamber interposed between the cap 34 and the lens 25 in the direction as indicated by the arrow A5 and then discharged through the gas discharge outlet G4 to the tubular path L3b.

The barrel 26 is assembled in ambient atmosphere in usual cases, so that attachment of a contaminating material to the surfaces of the lenses 21 to 25 is inevitable. In accordance with the present invention, however, the illuminating lens unit 2 is configured such that the contaminating material attached to each of the lenses 21 to 25 can be removed easily and readily in a way as will be described hereinafter and further that attachment of such a contaminating material to the surface of a lens can be avoided upon assembly of the illuminating lens unit 2 with the illumination optical system IL.

More specifically, first, the casing 32 is exhausted in a vacuum state by opening the valve V11 in such a state that the valve V10 is closed. Thereafter, the valve V11 is closed and the valve V10 is opened to supply the casing 32 with nitrogen gas and fill the casing 32 with the nitrogen gas. In this state, each of the lenses 21 to 25, inclusive, is irradiated with ArF light through a glass member of the cap 33. As the lenses are irradiated with the ArF light, then the contaminating material attached on the surface of each of the lenses 21 to 25 and an inner surface of each of glass members 36 and 38 is allowed to be removed therefrom and to float in the nitrogen gas. While the lenses are irradiated in the manner as described above, the valve V11 is opened and the nitrogen gas present in the casing 32 is allowed to be discharged, thereby resulting in discharging the contaminating material floating in the nitrogen gas outside the casing 32. Then, the valve V11 is closed in the state in which the casing 32 is supplied with the nitrogen gas, and the pressure in the casing 32 is adjusted so as to reach a predetermined level. As the pressure has reached the predetermined level, then the valve V10 is closed, and the illuminating lens unit 2 is stored in this state. Alternatively, unlike in the above-mentioned state in which the casing 32 is filled with the nitrogen gas, the contaminating material may also be removed by irradiating the illuminating lens unit 2 with ArF light or light beams having wavelengths of 185 nm and 254 nm, emitting from a low-pressure mercury lamp, while keeping the nitrogen gas flowing. In the latter case where the low-pressure mercury lamp is used, the low-pressure mercury lamp is arranged in a row with the light source 1 and the light beam emitting from the low-pressure mercury lamp is led to the light sending system by means of a lens and/or a mirror. In this case, however, the optical system disposed behind the low-pressure mercury lamp and the light source may also be used in substantially the same manner as described above.

With the configuration as described above, the contaminating material attached to the surfaces of the lenses 21 to 25 can be removed easily and readily upon assembly of the barrel 26. Moreover, this manner can avoid the contamination of the lenses 21 to 25 until the illuminating lens unit 2 is assembled with the illumination optical system IL.

Figure 4:
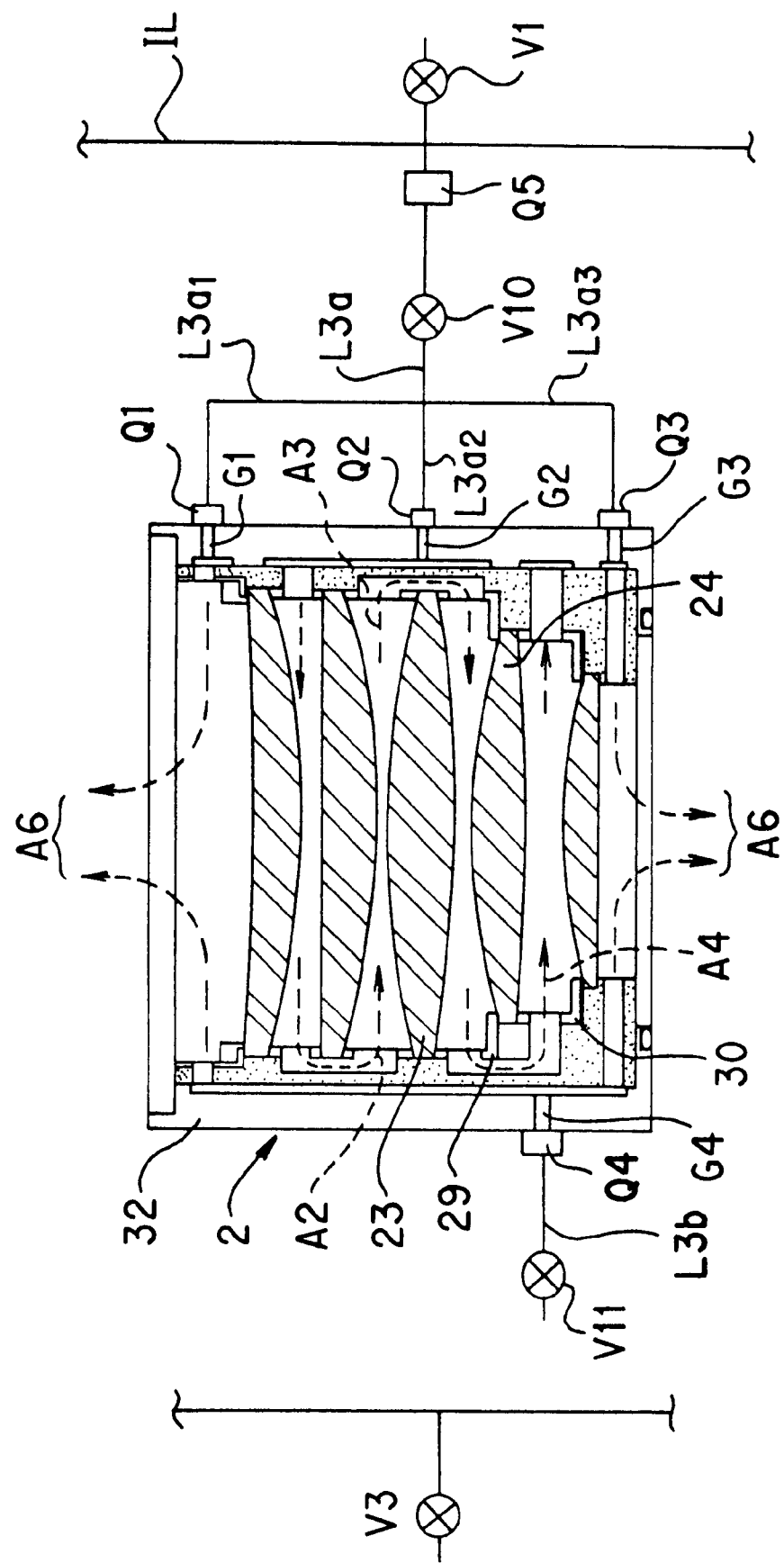
FIG. 4 is a view for explaining procedures of mounting the illuminating lens unit 2 on an illumination optical system IL.

Then, a description will be made of the procedures of the assembly of the illuminating lens unit 2 with the illumination optical system IL with reference to FIG. 4. First, the illumination optical system IL is wide open to ambient atmosphere, and the tubular path L3a of the illuminating lens unit 2 is connected to a nitrogen gas supply line of the valve V1 disposed in the illumination optical system IL. Then, the valves V1 and V10 are opened and the valve V11 is closed to supply the casing 32 with the nitrogen gas. Further, after the caps 33 and 34 (see FIG. 3) are detached while the nitrogen gas has been supplied, the valve V11 is opened and the illumination optical system IL is closed. At this time, the nitrogen gas is allowed to flow in each of the lens chambers in the direction as indicated by the respective arrows A1 to A4, inclusive, and the nitrogen gas to be supplied through the tubular paths L3a and L3b is allowed to flow in the direction as indicated by the arrow A6, so that the surface on the opening side of each of the lenses 21 and 25 is blocked from the open atmosphere by the nitrogen gas. In this configuration, the contamination of the lenses 21 to 25 can be prevented even upon assembly of the illuminating lens unit 2 with the illumination optical system IL.

As will be described hereinafter, the illumination optical system IL is exhausted in a vacuum state through the valve V3 after the assembly of the illuminating lens unit 2 with the illumination optical system IL, and the nitrogen gas is supplied to the illuminating lens unit 2 through the valve V1. At this time, the nitrogen gas supplied to the tubular path L3a through the quick coupler Q5 is allowed to flow into the illumination optical system IL after circulation through the illuminating lens unit 2 and discharged toward the outside through the valve V3. Although the caps 33 and 34 have been detached upon assembly of the illuminating lens unit 2 with the exposure apparatus in the manner as described above, the such assembly can also be made in some device configuration without detaching the caps 33 and 34. In such a case, as the surface on the atmospheric side of each of the glass members 36 and 38 of the respective caps 33 and 34 is contaminated with water or otherwise, the contaminating material can be removed thoroughly from the illuminating lens unit 2, for instance, simply by exchanging new caps non-contaminated for the old caps 33 and 34. It is further to be noted herein that the method for removing the contaminating material by supplying the nitrogen gas and irradiating the illuminating lens unit 2 with the illuminating light in the manner as described above can also be applied to the projecting lens unit 4, without limiting to the illuminating lens unit 2.

Description of the Details of the Projecting Lens Unit 4

Figure 5:
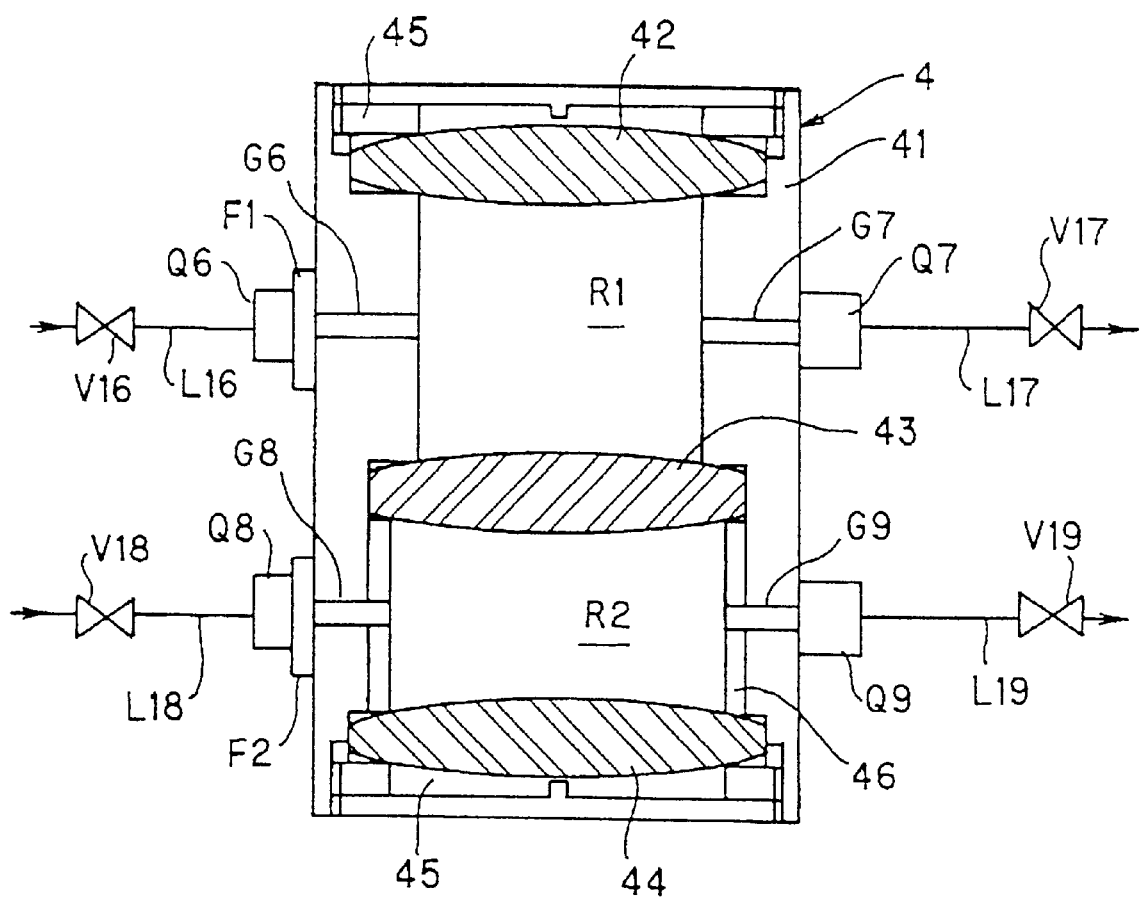
FIG. 5 is a sectional view showing a projecting lens unit 4.

FIG. 5 is a view in section of an outline of the projecting lens unit 4 to be disposed in the projection optical system PL. A barrel 41 of the projecting lens unit 4 has three lenses 42, 43 and 44 disposed in a relationship spaced apart in a predetermined distance from one another, and fixed thereto by means of a pressing ring 45. Reference numeral 46 denotes a lens separation ring for holding the lenses 43 and 44 apart in a predetermined distance from each other. It should be noted herein, however, that although the projecting lens unit 4 is provided with a number of lenses in an actual case, FIG. 5 shows only three lenses for brevity of explanation. A lens chamber R1 is formed between the lenses 42 and 43, and a lens chamber R2 is formed between the lenses 43 and 44. The lens chamber R1 is provided with a gas supply inlet G6 having a quick coupler Q6 mounted thereon and with a gas discharge outlet G7 having a quick coupler Q7 mounted thereon. On the other hand, the lens chamber R2 is provided with a gas supply inlet G8 having a quick coupler Q8 mounted thereon and with a gas discharge outlet G9 having a quick coupler Q9 mounted thereon. Between the gas supply inlet G6 and the quick coupler Q6 is interposed a chemical filter F1. Likewise, between the gas supply inlet G8 and the quick coupler Q8 is interposed a chemical filter F2. The chemical filters F1 and F2 are disposed with the attempt to remove impurities such as, for example, organic substances and alcohols, present in the nitrogen gas to be supplied.

Now, a description will be made of details of the chemical filter. As a filter for removing ions, there may be used, for example, an ion exchange resin, an ion exchange fiber, or the like. As a filter for use in treating gases, an ion exchange fiber is preferred in terms of a larger surface area, a higher reaction velocity, and easiness of processing. Such an ion exchange fiber may be prepared by graft polymerization of a polymer fiber such as, for example, polypropylene fiber, by means of radiation. The ion exchange fiber may be divided into two groups, i.e., an acidic cation exchange fiber and a basic anion exchange fiber. An acidic cation exchange fiber may be preferably used for an positive ion such as, for example, $NH_4^+$ or an amine ion, or a basic gas, and a basic anion exchange fiber may be preferably used for a negative ion such as, for example, $SO_4^{2-}$ or NOx, or an acidic gas.

FIG. 5 shows the quick couplers Q6 to Q9 having valves V16 to V19 mounted on tubular paths L16 to L19 thereof, respectively, in order to control a flow of the gas to be supplied through each of the gas supply inlets G6 and G8 for each of the lens chambers R1 and R2, respectively. In the case of the projecting lens unit 4, too, it is inevitable that a contaminating material is attached to surfaces of the lenses 42 to 44, inclusive, upon assembly of a barrel thereof, likewise in the case of the illuminating lens unit 2 in the manner as described above. In this case, too, such a contaminating material attached to the surfaces of the lenses for the projecting lens unit 4 can also be removed in substantially the same procedures as in the case of the Illuminating lens unit 2, i.e., by irradiating the projecting lens unit 4 with ArF light while flowing nitrogen gas through the gas supply inlets G6 and G8. A description of the specific procedures for removing such a contaminating material from the projecting lens unit 4 will be omitted from the following explanation because they are substantially the same as in the case of the illuminating lens unit 2.

Figure 6:
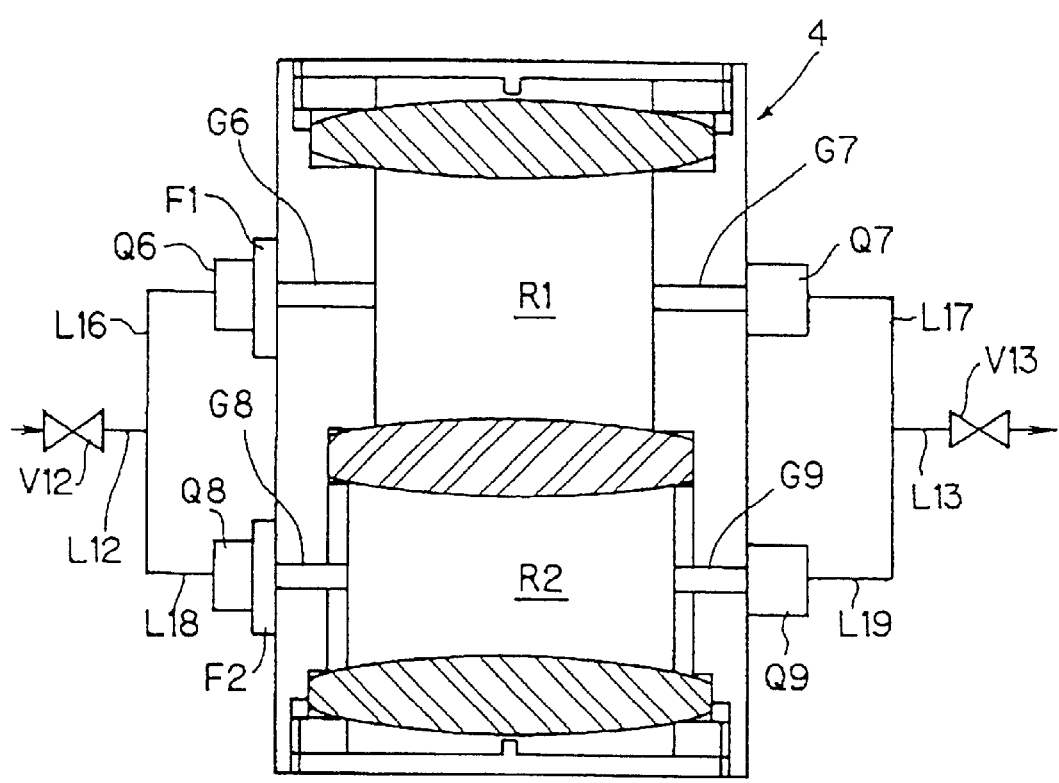
FIG. 6 is a view showing a first variation of the projecting lens unit of FIG. 5.

In the embodiment as shown In FIG. 5, the tubular paths L16 and L19, Inclusive, are provided each with a valve so as to control a flow of a gas for each of the lens chambers R1 and R2. It should be noted herein, however, that, as long as a flow amount of a gas that flows through the lens chambers R1 and R2 is not reduced to an extremely low extent, tubular paths L16 and L18 are combined into one tubular path L12, on the one hand, and tubular paths L17 and L19 are combined into one tubular path L13, on the one hand, and the combined tubular paths L12 and L13 are provided with valves V12 and V13, respectively, as shown in FIG. 6, in order to control a flow of the gas through the projecting lens unit 4. Although FIG. 6 shows only three lenses for t he projecting lens unit 4 and only one lens chamber for collectively discharging the gas therefrom, the projecting lens unit 4 is actually provided with a number of lenses so that a plurality of lens chambers are formed. Therefore, in such a case, the number of the lens chambers for collectively discharging the gas for a plurality of lenses may be two or more. A gas supply inlet and a gas discharge outlet are provided for each of the lens chambers as shown in FIGS. 5 and 6, however, a line may be provided only for a lens chamber that can be expected to achieve the highest effect from the design point of view.

Figure 7:
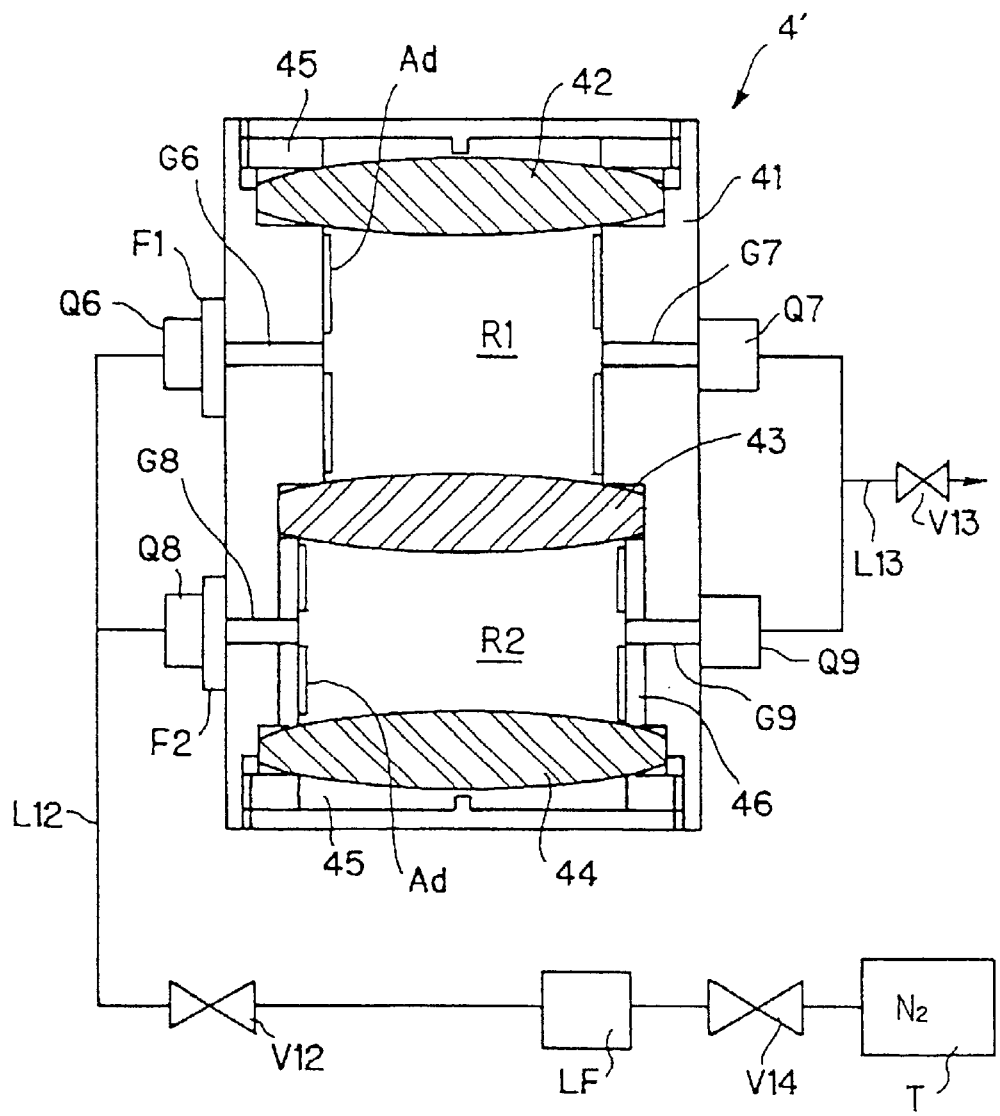
FIG. 7 is a view showing a second variation of the projecting lens unit of FIG. 5.
Figure 8:
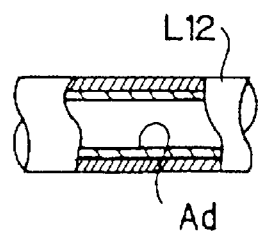
FIG. 8 is a sectional view showing a tubular path L12 as shown in FIG. 7.

FIG. 7 shows a variation of the projecting lens unit as shown in FIG. 6, in which the portions and elements identical to those as shown in FIG. 6 are provided with the identical reference numerals and symbols. A description will be made mainly of the portions and elements that differ from those of FIG. 6. As shown in FIG. 7, a projecting lens unit 4' has an inner wall surface of each of the lens chambers R1 and R2 as well as an inner wall surface of the tubular path L12 for supply of a gas coated with an adsorbing material Ad in order to remove water and so on present in a nitrogen gas to be supplied through a nitrogen gas supply source T. The adsorbing material may include, for example, activated carbon, silica gel, zeolite, and so on. In FIG. 7, reference symbol LF sets forth a line filter, and reference symbol V14 sets forth a valve.

Then, a description will be made of the operation of the illuminating lens unit 2 and the projecting lens unit 4, each having the configuration as described above, after they are assembled with the exposure apparatus. Each of the illumination optical system IL, the projection optical system PL and the reticle R is enclosed with a container from which in turn the air is exhausted into a vacuum state sequentially by the action of the rotary pump RP through the valves V3, V4 and V8, respectively. At this time, the air is discharged from the inside of each of the illuminating lens unit 2 and the projecting lens unit 4 to a vacuum state in the like manner. The degree of vacuum in each of the containers can be known on the basis of the concentration of oxygen to be detected by an oxygen sensor S mounted on each of the respective containers. After the vacuum state has been realized to a predetermined level, the container enclosing each of the illumination optical system IL and the projection optical system PL is supplied with nitrogen gas to a level higher than the atmospheric pressure through the valves V1 and V2, respectively. Further, the container enclosing the reticle R is supplied with an appropriately ionized nitrogen gas to amount to a level higher than the atmospheric pressure through the valve V5. The ionized nitrogen gas can remove static electricity caused to be generated in the reticle R, thereby preventing an occurrence of damages of the reticle R resulting from static electricity.

On the other hand, an ionized nitrogen gas is supplied toward the wafer W in a space between the projection optical system PL and the wafer W through the valve V6 in the direction nearly perpendicular to the wafer W. In addition, an ionized nitrogen gas is further supplied through the valve V7 so as to block the surface of the wafer W from the open atmosphere. This can remove static electricity generated on the surface of the wafer W by means of the action of the ionized nitrogen gas supplied, thereby preventing the wafer W from being damaged or stained by static electricity.

Upon subjecting the wafer W to projection exposure or exchanging wafers, an ionized nitrogen gas is supplied in a generally continual manner to a space between the projection optical system PL and the wafer W. Therefore, the nitrogen gas atmosphere will not be broken in a substantial manner even upon exchanging wafers. Moreover, only when the reticle R has to be exchanged, it is required that an ionized nitrogen gas has to be supplied to a container enclosing the reticle R by drawing a vacuum after exchanging reticles. On the other hand, for a container enclosing the illumination optical system IL and the projection optical system PL, the valves V1 to V4, inclusive, may be closed in a state in which it is filled with an ionized nitrogen gas or an ionized nitrogen gas may be supplied in a continual manner. In particular, the continual supply of the ionized nitrogen gas presents the advantages as will be described hereinafter.

Even if contaminating materials would have been removed after the assembly of the illuminating lens unit 2 and the projecting lens unit 4 in the manner as described above, there is the risk that the surfaces of lenses may be contaminated with moisture and so on after the assembly with the exposure apparatus by causing moisture and so on attached to the inner wall surfaces of the casing 32 and the lens chambers R1 and R2 to be released. However, when the ionized nitrogen gas is supplied continually after the assembly in the manner as described above, each of the lenses is irradiated with ArF light by the exposure operation and the irradiation of such ArF light allows the contaminating materials released from the lens surfaces to be exhausted outside the container together with the nitrogen gas. Therefore, the lens surfaces are not contaminated again with moisture and so on even if they would be released from the inner surfaces thereof. In the embodiment as described above, a description has been made by taking the illuminating lens unit 2 and the projecting lens unit 4, each consisting of plural lenses, as an example, however, it should be noted herein that the present invention can be applied in a like manner to an optical system consisting of reflecting mirrors.

When such an inert gas has been flown continually inside and outside the barrel in the manner as described above, adhesive or filling material used for fixing an optical element such as, for example, a lens, or the like to the barrel (a holding member) of the illumination optical system, the projection optical system or the light sending system in the exposure apparatus is irradiated with radiating beams having an ultraviolet wavelength region and gases consisting of organic materials, etc. derived from the adhesive or filling material, or reaction products, etc. resulting from such gases may be generated. Even in such a case, this can prevent such gases from attaching to the optical member or entering into the optical path and floating therein. This can also prevent a fluctuation in optical characteristics (e.g., transmittance, reflectance, etc.) of optical members, which may be caused by the irradiation with light beams, or in optical characteristics such as, for example, focal distance, projection magnification, five aberrations of Seidel, telecentricity, etc. in the projection optical system. As a consequence, a fluctuation in the intensity of illuminating light on the mask or substrate can be prevented, so that a pattern of a mask can be transferred onto a substrate always at an appropriate amount of exposing light, and an image of the pattern on the mask can be projected on the substrate always under appropriate imaging conditions.

In addition, the present invention can be applied to the ready implementation of a so-called light cleaning operation for optical members in an exposure apparatus for use in the lithography process for manufacturing micro devices such as semiconductor elements, thin layer magnetic heads, image pickup elements (CCD) and so on, by utilizing the method for the removal of contaminating materials in the manner as described above. The present invention allows contaminating materials attached on the surface of the optical member (e.g., gases derived therefrom or reaction products resulting from such gases, or impurities such as, for example, water or hydrocarbons to be generated from the inner wall of the barrel, etc.) to be removed simply by irradiating the optical member of the illumination optical system, the projection optical system or the light sending system or otherwise with light beams or illuminating light for exposing, for example, having a wavelength of 185 nm or 254 nm, while the illumination optical system, the projection optical system or the light sending system or otherwise is incorporated into the exposure apparatus.

The optical system to be installed in the exposure apparatus to which the optical device or the cleaning method according to the present invention can be applied may include, for example, an illumination optical system consisting of a plurality of optical elements such as, for example, optical integrators (flyeye lenses) or condenser lenses and illuminating a mask with an exposing light, or a projection optical system (including, for example, a catadioptric optical system) consisting of a plurality of optical elements (refracting elements and/or reflecting elements) arranged along the optical axis thereof and projecting an image of a pattern formed on a mask onto a substrate (such as, for example, a semiconductor wafer, etc.). Moreover, they may include optical systems which comprise, for example, (1) a light sending system having at least one optical element (such as, for example, a movable mirror, parallel flat panel, etc.) for adjusting the position relationship of the optical axis of the illumination optical system with the illuminating light and leading the illuminating light leaving from a light source disposed on a floor of a clean room separately from the main body of the exposure apparatus; (2) an alignment optical system for detecting the position of an alignment mark on the mask or the substrate by irradiating the mask or the substrate with the illuminating light having an ultraviolet wavelength region; and (3) an optical system of a measurement device for detecting optical characteristics (such as, for example, projection magnification, etc. as described above) of the projection optical system, which is so configured such that a light generating from a mark and passing through the projection optical system is received when a reference mark or a measurement mark on a stage with the mask or the substrate loaded thereon is irradiated with an exposing light or an illuminating light having the wavelength substantially equal to that of the exposing light.

Moreover, when the present invention is applied to the alignment optical system as described above, a fluctuation in the intensity of the illuminating light (an alignment light) to be irradiated on the alignment mark, which may be caused by a fluctuation in the transmittance or reflectance of the optical member, can be prevented. Further, a deterioration in the telecentricity of the illuminating light and so on can also be prevented, which may be caused by a decrease in uniformity of illuminance of the illuminating light on the alignment mark, i.e., by the formation of an irregularity in illuminance, due to the resence of such gases derived from the adhesive or filling materials used for fixing the optical members to the barrel or such reaction products from such gases, or by a decrease in uniformity of the light intensity in a pupil region of the alignment optical system through which a light flux of the illuminating light focusing on one point on the alignment mark passes. As a consequence, the mask can be aligned with the substrate at a high degree of precision without causing any decrease in precision of detecting the position of the alignment mark.

In addition, when the present invention is applied to the measurement optical system, like the alignment optical system, there can be prevented a fluctuation in the intensity of the illuminating light on the mark due to a fluctuation in the transmittance or reflectance of the optical member, as well as an irregularity of illuminance and a decrease in telecentricity. As a result, the optical characteristics of the projection optical system can be detected at a high degree of precision.

It can also be noted herein that the present invention can further be applied to an exposure apparatus which uses $F_2$ laser having a wavelength of 157 nm as an exposing light source. In other words, the present invention is effective for a vacuum ultraviolet light (VUV light) having a wavelength region of 100 nm to 200 nm, particularly for a VUV light having a wavelength region of 150 nm to 200 nm. This is because a light having a wavelength region shorter than 150 nm may be likely to undergo the limitations to a large extent from a glass material, a coating material, and so on.

It can now be noted herein that the terms as referred to in the embodiments as described above correspond to the elements as used in the Claims section of the specification of this application as will be referred to herein. In the embodiments of the present invention as described above, the reticle R corresponds to a mask as referred to so in the Claims section of the specification; the illuminating lens unit 2 and projecting lens units 4 and 4' to an optical lens device; caps 33 and 34 each to a protective filter; tubular path L12 to a supply passage; and the valve V12 to a movable member. It is further to be noted herein that the term "inert gas" referred to in this specification should be understood to include nitrogen gas.

As described above, the present invention can offer the effects as will be described hereinafter.

As the protective filer defining a predetermined space is provided between both ends of each of the plural optical elements, and not only each of the spaces between the optical element and the protective filter but also each of the chambers disposed between the plural optical elements are filled with an inert gas, each of the chambers and the spaces can be purged and cleaned with the inert gas after the assembly of a single body of the optical device, thereby assembling the optical device with the projection exposure apparatus in a state in which the optical elements located on the both sides are not contaminated.

Further, as the optical device is assembled while the space interposed between the protective filter and the optical elements disposed on the both sides thereof is purged with such an inert gas, the optical elements or the protective filter can be prevented from contamination at the time of assembly.

Moreover, in accordance with the present invention, the protective filter is detached while the space interposed between the protective filter and the optical elements on the both sides thereof and a pre-cleaned protective filter is then mounted thereon, so that the optical elements or the protective filter can be prevented from contamination at the time of assembly.

An adsorbing material is mounted on an inner face of the supply passage of the inert gas and the barrel, so that a contaminating material in the inert gas supplied, if it is present therein, can be adsorbed on the absorbing material, and there can be avoided the risk that the surface of the lens or the reflecting mirror is contaminated.

In addition, a filter is disposed on the side downstream of the movable member such as an electromagnetic valve, so that a contamination of the surface of the lens and the surface of the reflecting mirror with the contaminating material generating from the movable member can be prevented.

Furthermore, the contaminating materials can be removed for sure because each of the chambers among the plural optical elements is so arranged that it can be purged individually with the inert gas.

Moreover, the plural chambers interposed each between the plural optical elements are divided into at least two groups, each group containing a predetermined number of chambers, and each group can be arranged so as to be purged with an inert gas. Therefore, a number of valves for controlling the passage of a gas can be minimized, so that this construction can contribute to a reduction in costs for manufacturing the optical device as a whole.

Also, the contaminating materials attached to the optical elements can be caused to be afloat by the irradiation with the illuminating light after the optical device has been filled with the inert gas, and then the inert gas, together with the floating contaminating materials, can be discharged from the optical device. Therefore, the contaminating materials attached to the surface of each optical element can be removed in such a state that the optical device is assembled as a single body.

In accordance with the present invention, a pre-cleaned optical device can be assembled with the projection exposure apparatus as an illumination optical system or a projection optical system, so that a decrease in transmittance for the lenses or in reflectance for a reflecting mirror can be controlled even immediately after assembly.

Further, the present invention can prevent the optical system such as the projection optical system, the light sending system, and so on from being contaminated, so that a fluctuation in the optical characteristics of the optical system such as the projection optical system, the light sending system, and so on can be controlled, and projection exposure at a high degree of precision can be implemented.

What is claimed is:

1. An exposing method for irradiating a mask with an illuminating light and transferring a pattern on the mask onto a substrate through a projection optical system, said method comprising the steps of:

supplying a gas having a lower capability of absorbing the illuminating light to each of plural chambers each being formed between plural optical elements disposed in a barrel;

floating a contaminating substance attached to a surface of each of the plural optical elements in the gas by irradiating the plural optical elements with a light for removing the contaminating substance in a state in which the gas is supplied;

exhausting the gas, in which the contaminating substance is floating in each of the chambers, from the barrel;

supplying each of the plural chambers with further gas after exhausting the gas in which the contaminating substance is floating; and transferring the pattern onto the substrate.

2. The exposing method as claimed in claim 1, wherein:

the plural chambers are filled with the further gas, after exhausting the gas in which the contaminating substance is floating; and the pattern is transferred onto the substrate in a state in which the plural chambers are filled with the further gas.

3. The exposing method as claimed in claim 1, wherein:

the pattern is transferred onto the substrate while continuing the supply of the further gas to the plural chambers, after exhausting the gas in which the contaminating substance is floating.

4. The exposing method as claimed in claim 1, wherein the light for removing the contaminating substance comprises the illuminating light.

5. The exposing method as claimed in claim 1, wherein:

a part of gas existing in the barrel is exhausted prior to the supplying step for supplying with the gas which is carried out before the irradiation with the light for removing the contaminating substance.

6. An exposing method for transferring a pattern formed on a mask onto a substrate with an exposing light emitted from a light source, said method comprising the steps of:

prior to an exposure operation by which the pattern formed on the mask is transferred onto the substrate, supplying an inert gas to spaces each of which is formed between plural optical elements disposed between the light source and the substrate;

removing a contaminating substance attached to a surface of each of the plural optical elements from the surface by irradiating each of the optical elements with the exposing light;

exhausting the contaminating substance together with the inert gas from the spaces; and supplying each of the spaces with further insert gas, thereby resulting in filling the space with the further inert gas.

7. The exposing method as claimed in claim 6, wherein:

at least a part of a gas existing in the spaces is exhausted prior to the supplying step for supplying the spaces with the further inert gas.

8. The exposing method as claimed in claim 7, wherein:

the irradiation of the optical elements with the exposing light is carried out after a pre-set pressure of the inert gas in the spaces has been reached.

9. The exposing method as claimed in claim 6, wherein:

the irradiation of the optical elements with the exposing light is carried out in a state in which the supplying step for supplying the spaces with the further inert gas and the exhausting step for exhausting the inert gas from the spaces are suspended.

10. The exposing method as claimed in claim 6, wherein:

the supplying and the exhausting steps of the inert gas are continuously carried out during the exposure operation.

11. The exposing method as claimed in claim 6, wherein:

the supplying and the exhausting steps of the insert gas are continuously carried out during the exposure operation, thereby resulting in discharging the contaminating substance left from a holding member for holding the optical elements.

12. The exposing method as claimed in claim 6, wherein:

the contaminating substance is water or an organic substance.

13. The exposing method as claimed in claim 12, wherein:

the contaminating substance is left from a holding member for holding the optical elements.

14. The exposing method as claimed in claim 6, wherein:

the gas is nitrogen or helium.

\* \* \* \* \*